(12) United States Patent
Ide et al.

(10) Patent No.: US 10,278,286 B2
(45) Date of Patent: Apr. 30, 2019

(54) CONNECTION SUBSTRATE

(71) Applicant: NGK Insulators, Ltd., Nagoya, Aichi (JP)

(72) Inventors: Akiyoshi Ide, Kasugai (JP); Tatsuro Takagaki, Nagoya (JP); Sugio Miyazawa, Kasugai (JP)

(73) Assignee: NGK INSULATORS, LTD., Nagoya, Aichi (JP)

( * ) Notice: Subject to any disclaimer, the term of this patent is extended or adjusted under 35 U.S.C. 154(b) by 0 days.

(21) Appl. No.: 16/108,317

(22) Filed: Aug. 22, 2018

(65) Prior Publication Data

US 2019/0014663 A1    Jan. 10, 2019

Related U.S. Application Data

(63) Continuation of application No. PCT/JP2017/006820, filed on Feb. 23, 2017.

(30) Foreign Application Priority Data

Mar. 11, 2016 (JP) .................................. 2016-048163

(51) Int. Cl.
H05K 1/11 (2006.01)
H05K 1/03 (2006.01)
(Continued)

(52) U.S. Cl.
CPC ........... H05K 1/115 (2013.01); H05K 1/0306 (2013.01); H05K 3/28 (2013.01); H05K 3/4061 (2013.01);
(Continued)

(58) Field of Classification Search
CPC ........ H05K 1/115; H05K 1/0306; H05K 3/28; H05K 3/4061; H03H 9/058
(Continued)

(56) References Cited

U.S. PATENT DOCUMENTS 5,614,043 A    3/1997 Ritland et al.
5,922,245 A    7/1999 Mohri et al.
(Continued)

FOREIGN PATENT DOCUMENTS

JP    62-296496 A    12/1987
JP    06-291435 A    10/1994
(Continued)

OTHER PUBLICATIONS

International Preliminary Report on Patentability for PCT/JP2017/006820, dated Sep. 11, 2018 (1 pg).
(Continued)

*Primary Examiner* — Tremesha S Willis
(74) *Attorney, Agent, or Firm* — Flynn Thiel, P.C.

(57) ABSTRACT

A through conductor 11 provided in a through hole of a ceramic substrate includes a metal porous body 20, glass phases 17 and 19 formed in pores 16A to 16D of the metal porous body 20 and spaces 30 and 31 in the pores. A ratio of an area of the pores is 5 to 50 percent in a cross section of the through conductor 11. It is provided that the through conductor 11 is separated into a first part 11A on a side of the first main surface 11a and a second part 11B on a side of the second main surface 11b in a direction B of thickness of the ceramic substrate, a ratio of an area of glass phases occupying the pores in the first part 11A is higher than a ratio of an area of glass phases occupying the pores in the second part 11B. A ratio of an area of spaces occupying the pores in the first part 11A is lower than a ratio of an area of the pores occupying the pores in the second part 11B.

3 Claims, 8 Drawing Sheets

(51) Int. Cl.
*H05K 3/40* (2006.01)
*H05K 3/28* (2006.01)
*H03H 9/05* (2006.01)

(52) U.S. Cl.
CPC ... *H03H 9/058* (2013.01); *H05K 2201/09745* (2013.01); *H05K 2203/1131* (2013.01); *H05K 2203/1147* (2013.01)

(58) Field of Classification Search
USPC .......................................................... 174/255
See application file for complete search history.

(56) References Cited

U.S. PATENT DOCUMENTS

| | | | |
|---|---|---|---|
| 9,161,450 | B2 | 10/2015 | Kamakura |
| 9,282,638 | B2 | 3/2016 | Bonkohara et al. |
| 9,954,160 | B2 | 4/2018 | Ishigami et al. |
| 2010/0096178 | A1 | 4/2010 | Kim et al. |
| 2015/0351241 | A1 | 12/2015 | Hirose et al. |
| 2015/0357254 | A1 | 12/2015 | Mikami |

FOREIGN PATENT DOCUMENTS

| | | | |
|---|---|---|---|
| JP | 09-046013 | A | 2/1997 |
| JP | 2003-101181 | A | 4/2003 |
| JP | 2005-063708 | A | 3/2005 |
| JP | 2005-093105 | A | 4/2005 |
| JP | 4154913 | B2 | 9/2008 |
| JP | 2010-098291 | A | 4/2010 |
| JP | 2011-176033 | A | 9/2011 |
| JP | 2012-114213 | A | 6/2012 |
| JP | 2013-165265 | A | 8/2013 |
| JP | 2013-219253 | A | 10/2013 |
| JP | 2015-065442 | A | 4/2015 |
| JP | 2015-119165 | A | 6/2015 |
| JP | 5820092 | B1 | 10/2015 |
| JP | 2015-231009 | A | 12/2015 |
| JP | 2016-004973 | A | 1/2016 |
| WO | WO 2014/106925 | A1 | 7/2014 |
| WO | WO 2015/141344 | A1 | 9/2015 |

OTHER PUBLICATIONS

English translation of Written Opinion of the International Searching Authority for PCT/JP2017/006820, dated May 16, 2017 (7 pgs).
U.S. Appl. No. 16/108 284, filed Aug. 22, 2018.
U.S. Appl. No. 16/108 339, filed Aug. 22, 2018.
International Search Report for PCT/JP2017/006820 (2 pgs).

CONNECTION SUBSTRATE

CROSS-REFERENCE TO RELATED APPLICATIONS

This is a continuation of International Application No. PCT/JP2017/006820, filed Feb. 23, 2017, which claims priority of Japanese Patent Application No. 2016-048163, filed Mar. 11, 2016, the entire contents of which are incorporated herein by reference.

TECHNICAL FIELD

The present invention relates to an electrical connection substrate in which a through conductor, such as a via conductor, is formed in a through hole.

RELATED ART STATEMENT

As a substrate for mounting an electronic device such as a SAW filter, it is used a substrate (via substrate) having the structure that a through hole is provided in an insulating substrate such as ceramic substrate and the through hole is embedded with a conductor to provide a through electrode. Recently, as the reduction of size of a communication apparatus represented by cellular phone, it is demanded miniaturization and reduction of height to an electronic device used therein. It is further demanded the reduction of the substrate thickness for the via substrate constituting the device.

Further, for attaining the miniaturization, it is necessary to make wirings on a surface of the substrate fine. It is thereby demanded that the size of the through electrode is made smaller and the precision of the position is made finer. Further, as the fine wirings are formed by photolithography or plating, for preventing failure due to invasion of liquid chemical during the steps of applying a resist or plating, it is particularly demanded that the through electrode is dense and its water-tightness is high.

It is proposed various kinds of solutions for densifying the through electrode. The solutions, however, aim at relatively thick substrates and through electrode of a large size. Desired results are not obtained in the case that a thin substrate and a through electrode of a small size are used.

For example, according to patent document 1, it is disclosed the method of forming a conductive protection film on a surface of a porous through electrode for preventing the invasion of resist liquid. In the case that the thickness of an insulating substrate is small, permeability of the through hole is high and the strength of the conductive protection film is insufficient so that it does not function as a protection film. Further, separation occurs along an interface of ceramics and metal due to a difference of thermal expansion.

According to the method of patent document 2, after a porous first conductor is formed as a through electrode, its pores are embedded with a second conductor. In the case that a ceramic substrate is used, however, due to a difference of thermal expansion of a metal as a conductor and ceramics, cracks or warpage of the substrate tends to occur after the substrate is thinned.

According to patent document 3, it is disclosed the method that metals containing an active metal are filled in a through hole of a ceramic substrate to form an active metal layer between the ceramic substrate and through electrode and to densify the active metal layer. However, in addition to the problem of generation of cracks due to the difference of thermal expansion of ceramic and metal as described above, the viscosity of a metal solder containing the active metal is very high. It is thereby difficult to fill it well in the case that the size of the through electrode is small.

According to the method disclosed in patent document 4, it is used a conductive paste containing an expansion agent in forming a through electrode. It is, however, difficult to fill all the cavities only with the expansion agent. Particularly in the case that it is thinned, the through electrode cannot be densified.

According to patent document 5, it is disclosed the method of positioning powdery conductive material in through holes of a ceramic substrate, respectively, and of filling glass paste therein. However, cracks or warping due to a difference of thermal expansion of ceramic and the powdery conductive material tends to occur. Further, as the through hole is smaller, it becomes difficult to position the powdery conductive material.

RELATED DOCUMENTS

Patent Documents (Patent document 1) Japanese Patent No. 4154913B
(Patent document 2) Japanese Patent Publication No. 2013-165265A
(Patent document 3) Japanese Patent publication No. 2015-065442A
(Patent document 4) Japanese Patent Publication No. H09-046013A
(Patent document 5) Japanese Patent Publication No. 2015-119165A

SUMMARY OF THE INVENTION

An object of the present invention is, in producing a connection substrate having a ceramic substrate and a through conductor provided in a through hole, to provide microstructure so that water-tightness of the through hole can be improved.

The present invention provides a connection substrate including a ceramic substrate having a through hole therein, and a through conductor provided in the through hole and having a first main surface and a second main surface. The through conductor includes a metal porous body, glass phases formed in pores of the metal porous body, and spaces in the pores. A ratio of an area of the pores is 5 to 50 percent in a cross section of the through conductor. It is provided that the through conductor is separated into a first part on the side of the first main surface and a second part on the side of the second main surface in a direction of thickness of the ceramic substrate. A ratio of an area of the glass phases occupying the pores in the first part is higher than a ratio of an area of the glass phases occupying the pores in the second part. A ratio of an area of the spaces occupying the pores in the first part is lower than a ratio of an area of the spaces occupying the pores in the second part.

Effects of the Invention

The inventors have reached the following findings in the course of studying water-tightness of the through conductor. That is, according to prior arts, a metal paste is supplied into a through hole of a ceramic substrate and then fired to obtain a through conductor. Such through conductor has the microstructure which is uniform as a whole. As the thickness of the ceramic substrate becomes extremely small, a part of open pores is communicated between both main surfaces of the through conductor, resulting in leakage of a trace amount of liquid.

Then, the inventors studied to reduce a number of pores in the metal porous body forming the through conductor. As the number of the pores of the metal porous body is small, separation at an interface between the through conductor and ceramic tends to occur due to the difference of the thermal expansion, resulting in deterioration of the water-tightness of through parts in which the separation occurs.

Then, the inventors reached the idea that a ratio of glass phases is made relatively high on the side of the first main surface of the through conductor and that the water-tightness is mainly supported on this side. As such, even in the case that the ratio of the glass phases is made higher and ratio of spaces is made lower on the side of the first main surface of the through conductor, by keeping a ratio of the glass phases low on the side of the second main surface of the through conductor, the separation of the through conductor and ceramic tends to be prevented as a whole so that the water-tightness is preserved.

EMBODIMENTS FOR CARRYING OUT THE INVENTION

The present invention will be described further in detail, appropriately referring to drawings. It will be described an example of a method of producing a ceramic substrate of the present invention first.

Figure 1A:
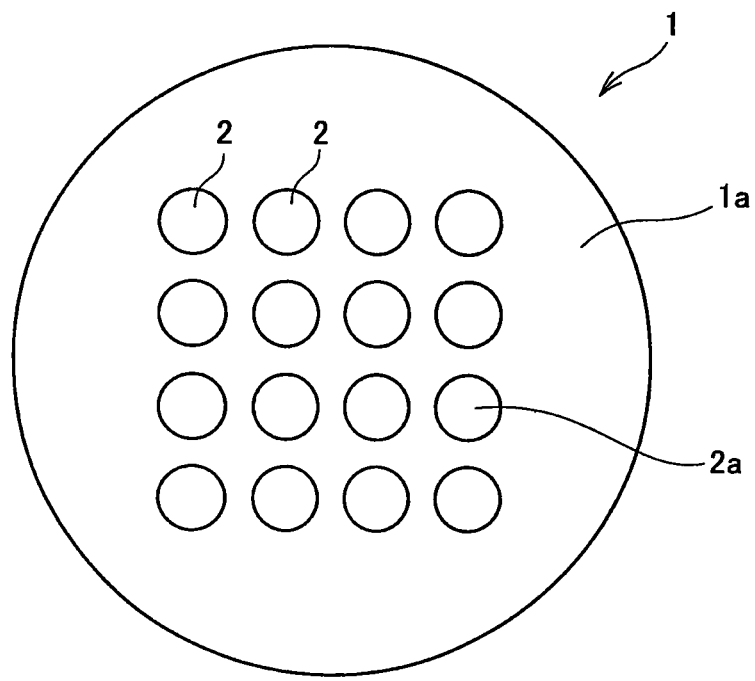
FIG. 1(a) is a plan view schematically showing a ceramic substrate 1 with through holes arranged therein.
Figure 1B:
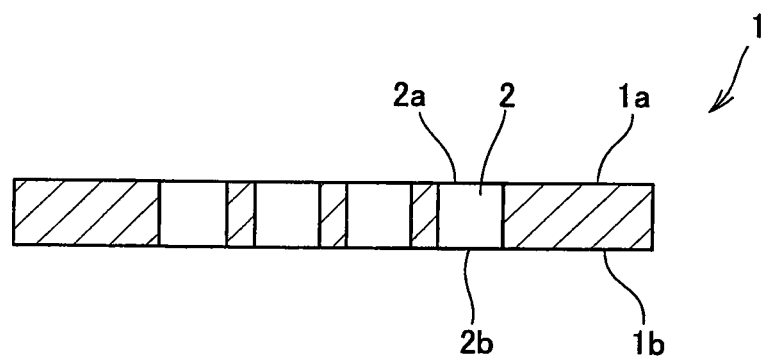
FIG. 1(b) is a cross sectional view showing the ceramic substrate 1.

As shown in FIG. 1, a first main surface 1a and a second main surface 1b are provided in a ceramic substrate 1, and it is formed many through holes penetrating through the main faces 1a and 1b. Openings 2a and 2b are provided on the sides of the first main surface 1a and second main surface 1b, respectively, in the through hole 2.

Figure 2A:
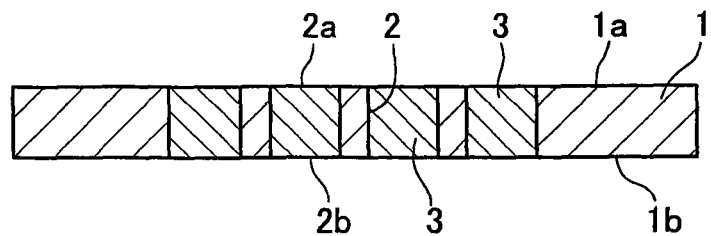
FIG. 2(a) shows the state that metal paste 3 is filled in the through holes of the ceramic substrate 1.
Figure 2B:
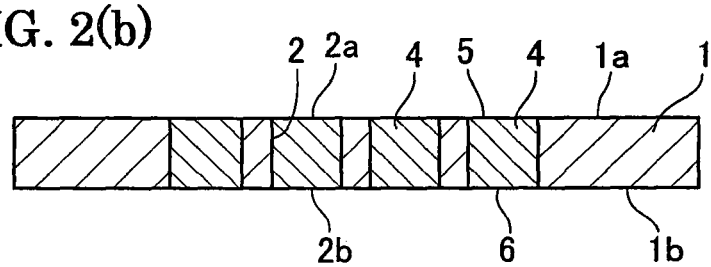
FIG. 2(b) shows the state that the metal paste 3 is fired to form a metal porous body 4.

Then, as shown in FIG. 2(a), a metal paste 3 is filled in the opening 2 of the ceramic substrate 1. Then, the metal paste 3 is heated to fire the metal paste to generate a metal porous body 4 in the through hole 2, as shown in FIG. 2(b). Here, according to the present example, the metal porous body 4 is elongated from the first main surface 1a to the second main surface 1b of the ceramic substrate 1. 5 represents a first main surface of the metal porous body 4, and 6 represents a second main surface of the metal porous body.

Figure 2C:
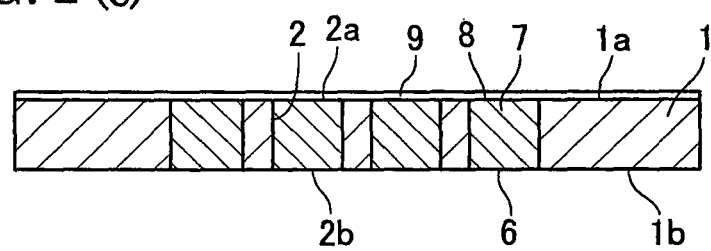
FIG. 2(c) shows the state that a glass layer 9 is formed on a first main surface 1a of the ceramic substrate 1.

Then, a glass paste is applied on the first main surface 1a of the ceramic substrate 1 to form a glass paste layer. At the same time, the glass paste applied on the first main surface 5 of the metal porous body 4 is impregnated into the open pores of the metal porous body 4. At this state, the glass paste is heated and fired to harden it. By this, as shown in FIG. 2(c), a glass layer 9 is formed on the first main face 1a of the ceramic substrate 1. At the same time, the glass paste impregnated into open pores of the metal porous body is hardened to form glass phases to thereby form a through conductor 7 in the through hole. Further, 8 represents a first main surface of the through conductor 7.

The glass layer 9 is then removed so that the through conductor is exposed to the side of the first main surface of the ceramic substrate to provide a connection substrate. At this time, preferably, the first main surface 1a of the ceramic substrate 1 is, further polished to form a polished surface 1c, so that a connection substrate 10 is obtained, as shown in FIG. 2(d).

Figure 2D:
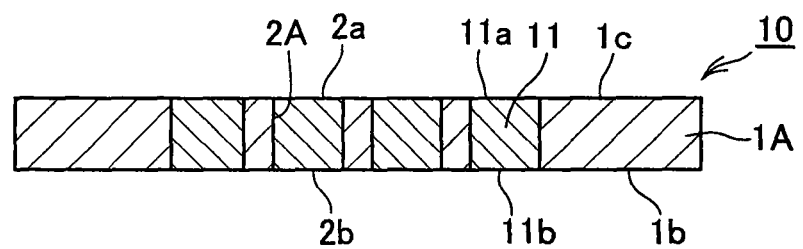
FIG. 2(d) shows the state that the glass layer 9 is removed.
Figure 3A:
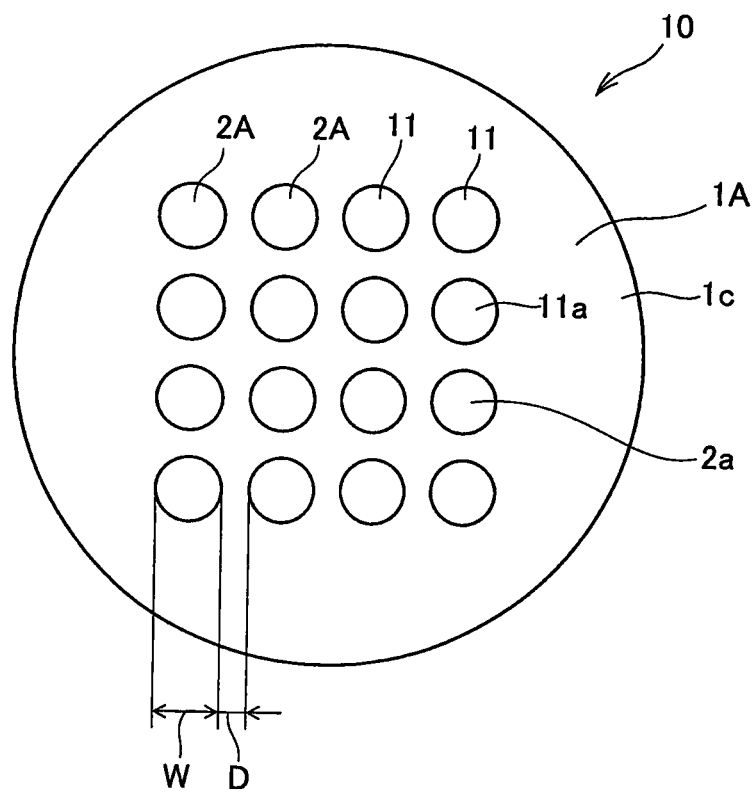
FIG. 3(a) is a plan view schematically showing a connection substrate 10 with through conductors 11 formed in through holes 2A.

As shown in FIG. 2(d) and FIGS. 3(a) and (b), in a ceramic substrate 1A of the connection substrate 10, the through conductor 11 is filled in each of the through holes 2A. 11a represents a first main surface of the through conductor 11, and 11b represents a second main surface of the through conductor 11.

Figure 4:
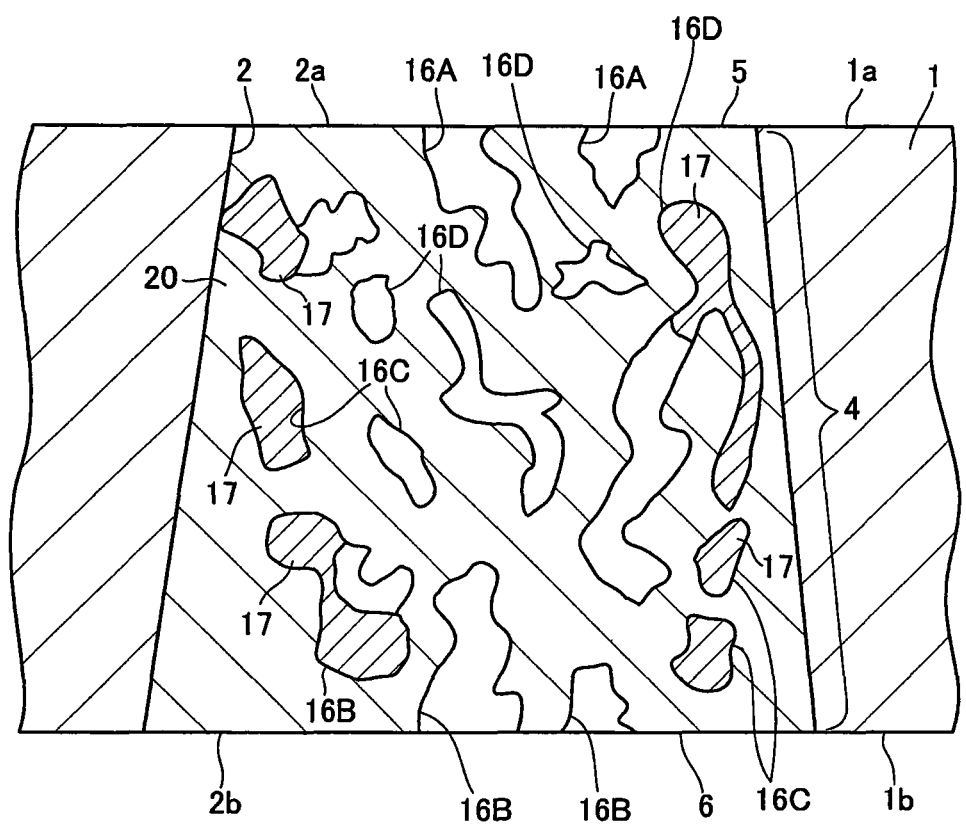
FIG. 4 is a schematic view showing structure of a metal porous body 4 formed in the through hole.

As shown in FIG. 4, the metal porous body 4 is composed of a metal matrix 20 having pores 16A, 16B, 16C and 16D. Besides, in the case that a glass component is added into the metal paste, a part of the pores is filled with glass phases 17. The pores generated in the matrix includes first open pores 16A and 16D opening at the first main surface 5, second open pores 16B opening at the second main surface 6, and closed pores 16C which are not opened at the main surfaces 5 and 6. Further, the open pores 16A is opened at the first main surface 5 on the cross section of FIG. 4. On the contrary, the open pores 16D is not opened at the first main face 5 on the cross section of FIG. 4 and is opened at the first main surface 5 through routes not shown in the cross section. The open pores 16A and 16D are thus distinguished.

According to the state shown in FIG. 4, a part of each of the open pores 16A, 16B, 16C and 16D is filled with the glass phase 17 and the remaining parts are left as the space.

Then, in the case that the ceramic substrate is subjected to water-tightness test, the leakage of water may be observed from the first main surface 1a to the second main surface 1b. The reasons are considered as follows. It is speculated that the first open pores 16A, 16D communicating with the first main surface 5 and the second open pores 16B communicating with the second main surface 6 are partly communicated with each other.

Figure 5:
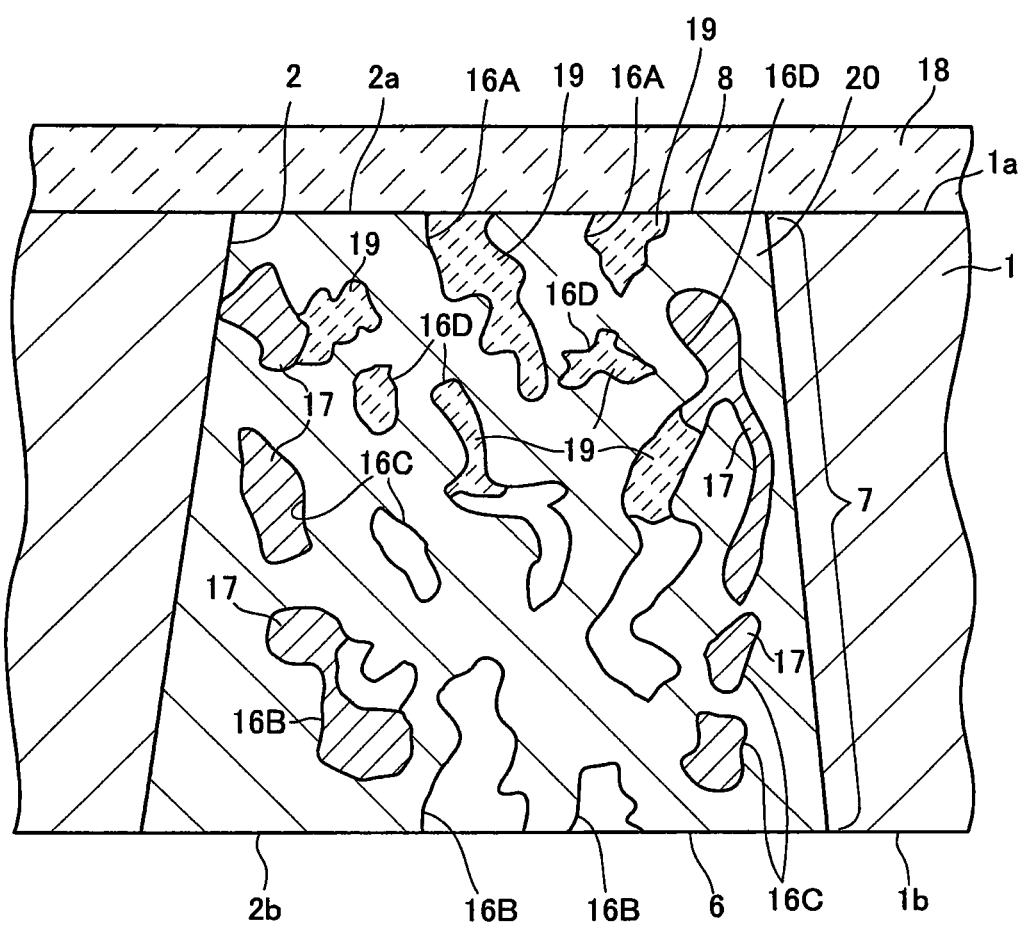
FIG. 5 is a schematic view showing a glass phase 19 impregnated in through holes 16A of the metal porous body 4 and a glass layer 18 formed on the first main surface 1a of the ceramic substrate 1.

On the other hand, as shown in FIG. 5, a glass paste is impregnated into the open pores 16A and 16D opening at the first main surface 5 from the side of the first main surface. At this state, the glass paste is fired so that the glass layer 18 is formed on the first main surface 1a and, at the same time, the glass phases 19 are formed in the open pores 16A and 16D. In a part of the open pores, it may be co-exist glass phases 17 originally included in the metal porous body and glass phases 19 generated by the impregnation and firing of the glass paste.

Then, by impregnating the glass paste from the side of the first main surface into the open pores of the metal porous body, at least a part of the open pores on the side of the first main surface is clogged with the glass phases 19. As a result, it is not left open pores communicating with the first main surface 5 and second main surface 6, so that the water-tightness can be considerably improved.

Figure 6:
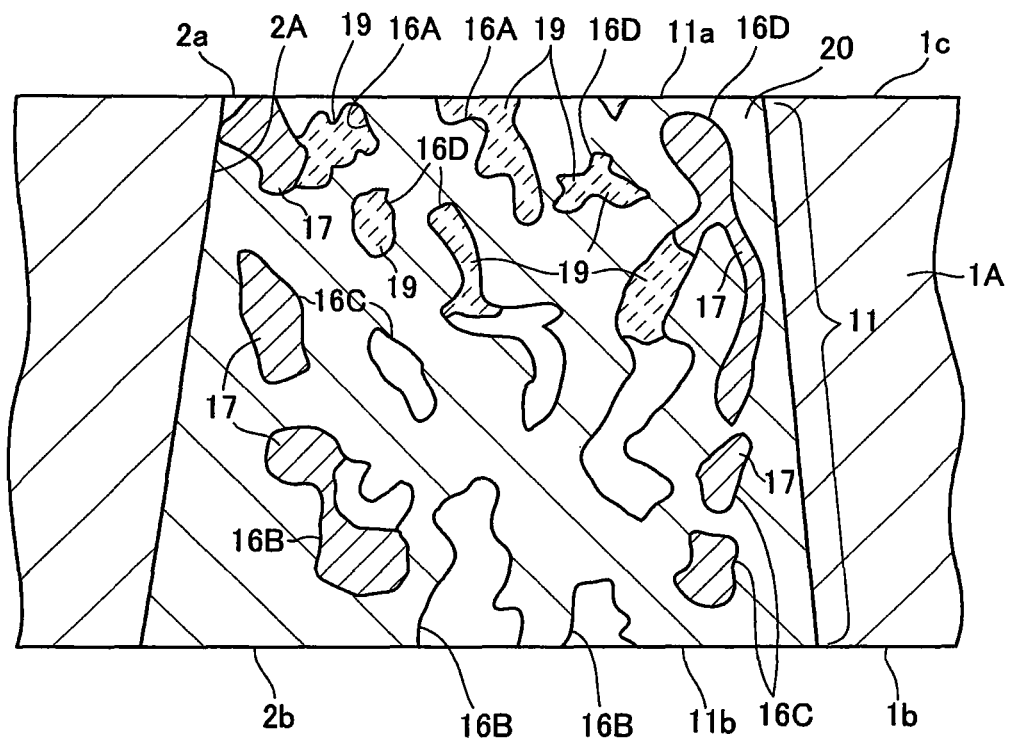
FIG. 6 is a schematic view showing structure of the through conductor 11 after the glass layer is removed.

In the state shown in FIG. 5, however, as the metal porous body is covered by the glass layer 18, both sides of the ceramic substrate 1 cannot be electrically conductive by the through conductor 7. Thus, according to the present invention, the unnecessary glass layer 18 is removed as shown in FIG. 6, so that the through conductor is exposed to the side of the first main surface. At this time, the first main surface of the ceramic substrate may be preferably be subjected to polishing to form a polished surface, so that the through conductor can be further assuredly exposed and the exposed surface can be made flat.

At this state, as shown in FIG. 6, a polished surface 1c is formed in a ceramic substrate 1A and the thickness of the ceramic substrate 1A is made smaller than that before the polishing. Further, a through conductor 11 is formed in the through hole 2A.

Here, as the through conductor having the shape shown in FIG. 6 is further analyzed, the followings are found. The mechanism of exhibiting the water-tightness will be described below referring to FIG. 7.

Figure 7:
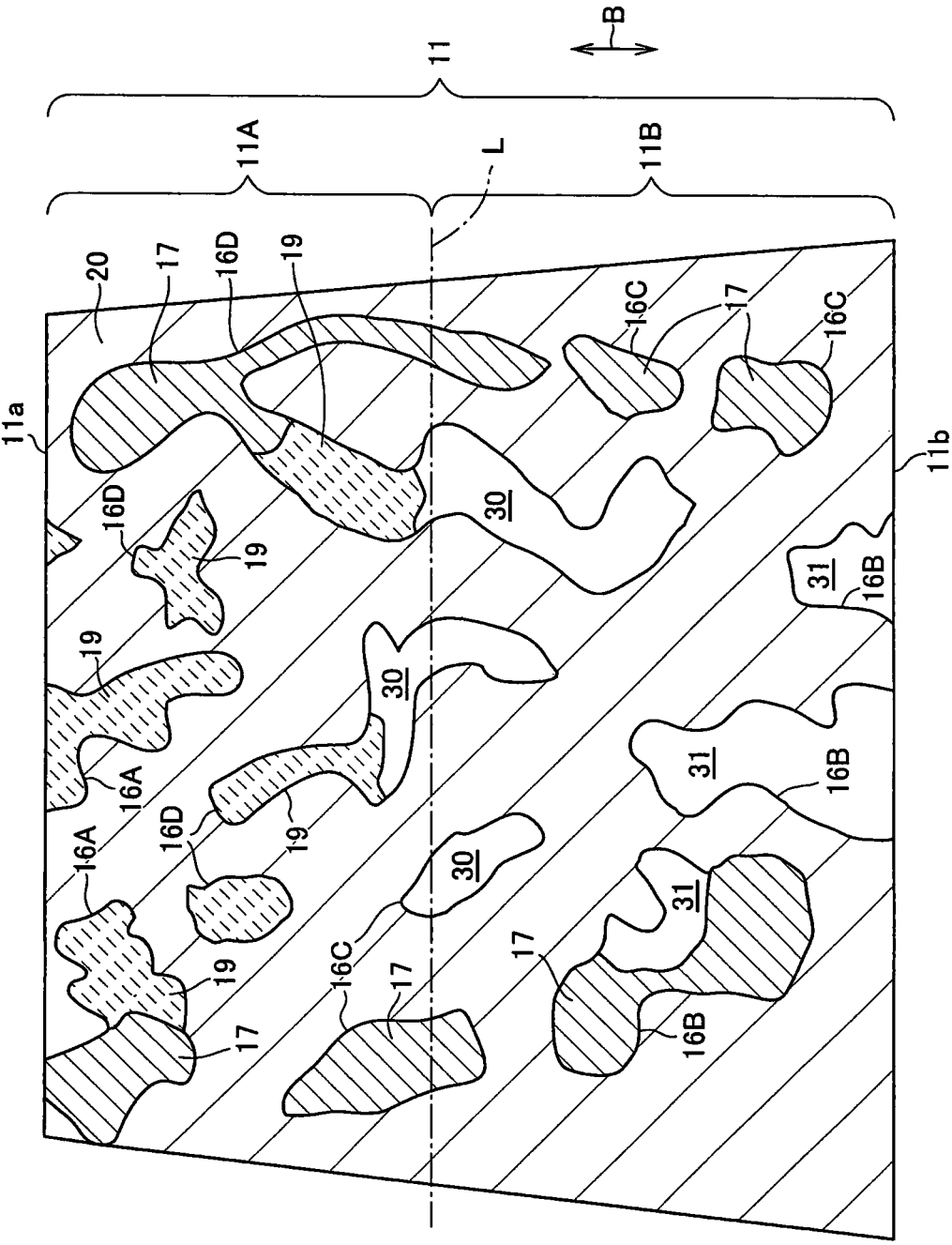
FIG. 7 is an enlarged view for illustrating the microstructure of the through conductor.

In FIG. 7, in the open pores 16A and 16D opening at the first main surface 11a, glass phases 17 derived from the metal paste, glass phases 19 derived from the glass paste impregnated afterward and spaces 30 which do not open at the main surface 11a are left. Further, in the open pores 16C, the glass phases 17 derived from the metal paste and spaces 30 which do not open at the main surfaces are left. Further, in the second open pores 16B opening at the second main surface 11b, the glass phases 17 derived from the metal paste, spaces 31 opening at the main surface 11b and spaces 30 which do not open at the main surfaces 11a and 11b are left.

Here, it is provided that the through conductor 11 is separated into a first part 11A on the side of the first main surface 11a and a second part 11B in a direction B of thickness of the ceramic substrate. Here, the first part and second part are considered to be separated at a central line L in the direction of thickness of the ceramic substrate. At this state, the ratio of the area of the glass phases 17 and 19 in the first part 11a is higher than the ratio of the area of the glass phases 17 and 19 of the second part 11B, and the ratio of the area of the spaces 30 and 31 in the first part 11A is lower than the ratio of the area of the spaces 30 and 31 in the second part. As such, by applying the microstructure that the ratios of the areas of the glass phases and spaces are changed in the direction of thickness of the through conductor, it is possible to preserve the water-tightness mainly in the first part 11A and to relax the difference of thermal expansion of the ceramic and metal in the second part 11B, preventing the separation of the through conductor.

Further, according to the examples described above, the glass paste is impregnated from the side of the first main surface of the through conductor, so that the ratio of the glass phases in the first part is made relatively higher. However, the present invention is not limited to this production method. For example, in the case that the metal paste is filled in the through hole, the compositions of the metal pastes can be changed in the upper and lower halves of the through hole, so that it can be produced the though conductor having the microstructure of the present invention.

The constituents of the present invention will be described below further.

According to the present invention, the ratio of the area of the pores in the cross section of the through conductor is 5 to 50 percent. In the case that the ratio of the area of the pores is too high, the water-tightness of the through conductor is deteriorated. On this viewpoint, the ratio of the area of the pores in the cross section of the through conductor is 50 percent or lower, and more preferably 40 percent or lower. Further, in the case that the ratio of the area of the pores is too low, the water-tightness is deteriorated by the separation due to the thermal expansion of the through conductor and ceramic. On the viewpoint, the ratio of the area of the pores is made 5 percent or higher and more preferably 15 percent or higher.

According to the present invention, the ratio of the area of the glass phases occupying the pores in the first part is made larger than the ratio of the area of the glass phases occupying the pores in the second part. A difference of the ratios of the areas may preferably be 10 percent or higher and more preferably be 15 percent or higher.

Further, according to the present invention, the ratio of area of the spaces occupying the pores in the first part is lower than the ratio of the area of the spaces occupying the pores in the second part. A difference of the ratios of the areas may preferably be 10 percent or larger and more preferably 15 percent or larger.

Further, on the viewpoint of improving the water-tightness, provided that 100 percent is assigned to the area of the pores in the first part, the ratios of the glass phases and spaces are preferably 60 to 90 percent and 10 to 40 percent, respectively, and more preferably be 70 to 90 percent and 10 to 30 percent, respectively. Further, on the similar viewpoint, provided that 100 percent is assigned to the area of the pores in the second part, the ratios of the glass phases and spaces are preferably 50 to 80 percent and 20 to 50 percent, respectively, and more preferably 60 to 80 percent and 20 to 40 percent, respectively.

Further, the ratios of the areas of the metal, glass and spaces are measured by taking an SEM photograph image (1000 folds) of the cross section of the through conductor. As the secondary electron images of the SEM of the metal phases, glass phases and spaces are different from each other, it is easy to distinguish them.

Figure 3B:
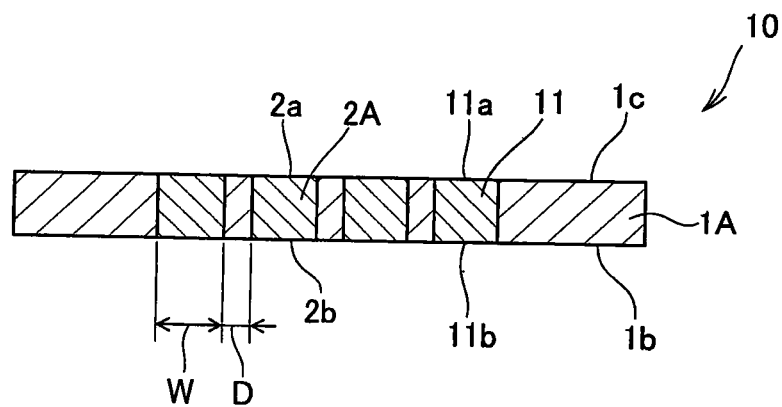
FIG. 3(b) is a cross sectional view showing the connection substrate 10.

According to a preferred embodiment, the thickness of the ceramic substrate is 25 to 150 μm and the diameter W (refer to FIGS. 3(a) and 3(b)) of the through hole is 20 to 60 μm. The present invention is particularly useful for such thin and small connection substrates.

The diameter W of the through hole formed in the ceramic substrate may more preferably be 25 μm or larger on the viewpoint of ease of molding. A distance D of the adjacent through holes (distance between through holes which are nearest to each other) may preferably be 50 μm or larger and more preferably be 100 μm or larger on the viewpoint of preventing fracture or cracks. Further, the distance D between the adjacent through holes 2 may preferably be 1000 μm or smaller and more preferably be 500 μm or smaller, on the viewpoint of improving the density of the through holes.

The method of forming the through holes in the ceramic substrate is not particularly limited. For example, the through holes may be formed by subjecting a green sheet of the ceramic substrate to processing by laser or a pin.

Alternatively, a blank substrate made of a ceramic material is produced, and the through holes may be then formed by laser processing in the blank substrate.

As ceramic materials forming the ceramic substrate, alumina, aluminum nitride, silicon nitride or zirconia are listed.

According to the present invention, the metal paste is supplied into the through hole and heated to generate the metal porous body. As a metal mainly constituting the metal paste, Ag, Au, Cu, Pd or the mixtures thereof may be listed. Further, a glass component may preferably be added to the metal to generate a paste. Such glass component includes various kinds of glasses of low melting points of lead or vanadium series, borosilicate glasses, alkali metal series glasses of low melting points, phosphorus acid series glasses and the like.

Although the temperature of firing of the metal paste is appropriately selected depending on the kind of the paste, it may be 500 to 900° C., for example.

Next, the glass paste is applied on the first main surface of the metal porous body and the glass paste is impregnated into the open pores of the metal porous body. At this time, the glass paste may be applied over the whole of the first main surface of the ceramic substrate. Alternatively, the glass paste may be applied only on the first main surface of the metal porous body and the glass paste is not applied on the remaining parts of the surface of the ceramic substrate, by means of screen printing or the like.

The glass paste is then hardened by heating, so that the glass layer is formed on the main surface of the metal porous body and the glass impregnated into the open pores is made the glass phases. Although the temperature of firing of the glass paste is selected depending on the kind of the paste, it may be 500 to 900° C., for example.

Then, at least the glass layer on the metal porous body is removed to obtain a connection substrate having the ceramic substrate and through conductors provided in the through holes. At this state, although it is sufficient that at least the glass layer is removed to expose the through conductor, the first main surface of the ceramic substrate is preferably polished. Then, predetermined wirings, pads or the like are formed on each of the main surfaces 11a and 11a of the ceramic substrate. Further, the ceramic substrate is made an integrated relay board.

The ceramic substrate is preferably subjected to precise polishing. As such precise polishing, CMP (chemical Mechanical Polishing) is generally used. As polishing slurry for CMP, it is used slurry including an alkaline or neutral solution with abrasives having a particle size of 30 nm to 200 nm dispersed. As materials of the abrasives, silica, alumina, diamond, zirconia and ceria are listed, and theses may be used alone or in combination. Further, as the polishing pad, hard urethane pad, non-woven pad or suedo pad may be listed.

EXAMPLES

Example 1

Connection substrates were produced as described referring to FIGS. 1 to 6.
Specifically, it was produced slurry by mixing the following components.
(Powdery Raw Material)

| | |
|---|---|
| α-alumina powder having a specific surface area of 3.5 to 4.5 m²/g and an average primary particle size of 0.35 to 0.45 μm (alumina purity of 99.99 percent) | 100 mass parts |

-continued

| | |
|---|---|
| MgO (magnesia) | 250 ppm |
| ZrO$_2$ (zirconia) | 400 ppm |
| Y$_2$O$_3$ | 15 ppm |
| (Dispersing medium) | |
| 2-ethyl hexanol | 45 weight parts |
| (Binder) | |
| PVB (polyvinyl butyral) resin | 4 weight parts |
| (Dispersing agent) | |
| High molecular surfactant | 3 weight percent |
| (Plasticizer) | |
| DOP | 0.1 weight parts |

The slurry was then shaped into a tape by doctor blade method to a thickness corresponding with the thickness after the sintering of 300 μm, and the tape was cut into pieces each having a diameter corresponding with a diameter φ of 100 mm after the sintering. The thus obtained powder-shaped body was calcined (preliminary sintering) in atmosphere at 1240° C. The calcined body was then mounted on a plate made of molybdenum and then sintered by holding under an atmosphere of hydrogen 3: nitrogen 1 at a temperature elevation rate of 50° C./h from 1300° C. to 1550° C. and a holding time of 2.5 hours at 1550° C., providing a blank substrate.

The blank substrate was subjected to laser processing under the following condition to form through holes having the following dimensions.

| | |
|---|---|
| CO$_2$ laser: Wavelength | 10.6 μm |
| Pulse: 1000 Hz-On time | 5 μs |
| Laser mask size: | 0.9 mm |
| Number of shots: | 40 counts |
| Size W of through hole: | 0.08 mm |
| Distance D of through holes: | 0.12 mm |
| Number of through holes: | 10000 counts/unit |

Then, during the laser processing, droth attached onto the substrate surface was removed by grinding with a grinder, and the substrate was then subjected to annealing under atmosphere at 1300° C. for 5 hours to obtain a ceramic substrate having a thickness of 200 μm.

Then, embedded printing of Ag paste was performed in the through holes. The Ag paste contained 10 percent or less of a glass component. Thereafter, it was sintered at 700° C. to form the metal porous bodies in the through holes. Then, glass paste of a borosilicate glass of a low melting point was printed on the main surface of the ceramic substrate and the glass paste was molten at 700° C.

The glass layer remaining on the surface was then removed by polishing to obtain a connection substrate. Specifically, the substrate was subjected to grinding by a grinder with the substrate adhered onto an alumina paste. Both surfaces of the substrate were subjected to lapping with diamond slurry. The grain size of the diamond was made 3 μM. It was finally performed CMP processing by SiO$_2$ and diamond abrasives. Thereafter, the substrate was separated from the alumina plate, the processing as described above was performed on the main surface on the opposite side, and cleaning was performed to obtain a connection substrate.

As to the thus obtained connection substrate, the cross section of the through conductor was observed as described above to obtain the following results.

| | |
|---|---|
| Ratio of area of pores in cross section of through conductor: | 40 percent |
| Ratio of area of glass phases occupying pores in first part: | 90 percent |
| Ratio of area of spaces occupying pores in first part: | 10 percent |
| Ratio of area of glass phases occupying pores in second part: | 75 percent |
| Ratio of area of spaces occupying pores in second part: | 25 percent |

Figure 8:
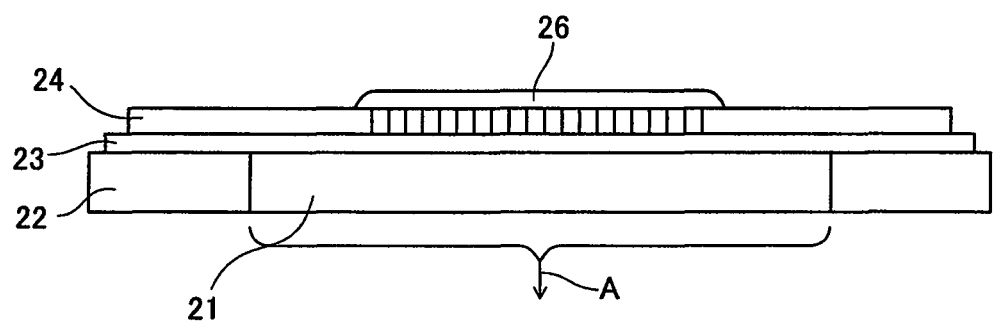
FIG. 8 is a schematic view for illustrating a method of testing water-tightness.

The water-tightness of the through conductor of the thus obtained connection substrate was confirmed by the method described referring to FIG. 8.

That is, a porous plate 21 was fixed on a table 22, a dust-free paper 23 was mounted on the table 22, and a sample 24 of the ceramic substrate was provided thereon. Water 26 was dropped on the through holes of the ceramic substrate 24, and water was sucked as an arrow A. it was then confirmed whether water content was attached onto the dust-free paper or not.

As a result, the number of the through conductors with the leakage of liquid observed was proved to be one, with respect to 10000 counts of the through conductors provided in a single ceramic substrate.

Examples 2 and 3

Connection substrates were produced as the Example 1.
However, the ratio of the area of the pores in the cross section of the through conductor, the ratio of the area of the glass phases in the first part, the ratio of the area of the spaces in the first part, the ratio of the area of the glass phases in the second part, and the ratio of the area of the spaces in the second part were changed as shown in Table 1. For changing these parameters, it was changed the temperature of melting the glass layer from 700° C. to 750° C. or 800° C. to lower the viscosity of the glass for the adjustment.

Then, as to the thus obtained ceramic substrates, it was measured the number of the through conductors with the leakage of liquid observed, in 10000 counts of the through conductors provided in a single ceramic substrate.

TABLE 1

| | Ex. 1 | Ex. 2 | Ex. 3 | Com. Ex. 1 |
|---|---|---|---|---|
| Ratio of area of pores in cross section of through conductor (%) | 40% | 40% | 40% | 40% |
| Ratio of area of glass phases in first part (%) | 90% | 85% | 70% | 20% |
| Ratio of area of spaces in first part (%) | 10% | 15% | 30% | 80% |
| Ratio of area of glass phases in second part (%) | 75% | 75% | 65% | 20% |
| Ratio of area of spaces in second part (%) | 25% | 25% | 35% | 80% |
| Number of through conductors with liquid leakage observed (counts) | 1 | 10 | 50 | 10000 |

Comparative Example 1

Ag paste was embedded into the respective through holes of the ceramic substrate as in the Example 1. The Ag paste used was the same as that used in the Example 1. Thereafter, the sintering was carried out at 700° C. to form metal porous bodies in the through holes, respectively.

Then, both main faces of the ceramic substrate were subjected to precise polishing, without performing the step of printing the glass paste on the first main face of the ceramic substrate. A connection substrate was thus obtained.

The cross section of the via part of the thus produced substrate was observed to prove that spaces were uniformly remained over the whole of the via parts. That is, the respective parameters reflecting the microstructure were as follows.

| | |
|---|---|
| Ratio of area of pores in cross section of through conductor: | 40 percent |
| Ratio of area of glass phases occupying pores in cross section of through conductor: | 20 percent |
| Ratio of area of spaces occupying pores in cross section of through conductor: | 80 percent |

It was then performed the water-tightness test as the Example 1. As a result, it was observed the leakage of liquid in substantially all of 10000 counts of the through conductors provided in the single ceramic substrate.

What is claimed is:

1. A connection substrate comprising a ceramic substrate and a through conductor, said ceramic substrate comprising a through hole therein, and said through conductor provided in said through hole and comprising a first main surface and a second main surface:
   wherein said through conductor comprises a metal porous body, glass phases formed in pores of said metal porous body and spaces in said pores;
   wherein a ratio of an area of said pores is 5 to 50 percent in a cross section of said through conductor;
   wherein it is provided that said through conductor is separated into a first part on a side of said first main surface and a second part on a side of said second main surface in a direction of thickness of said ceramic substrate, a ratio of an area of said glass phases occupying said pores in said first part being higher than a ratio of an area of said glass phases occupying said pores in said second part, and a ratio of an area of said spaces occupying said pores in said first part being lower than a ratio of an area of said spaces occupying said pores in said second part.

2. The connection substrate of claim 1,
   wherein said ratios of said areas of said glass phases and said spaces are 60 to 90 percent and 10 to 40 percent, respectively, provided that 100 percent is assigned to an area of said pores in said first part, and
   wherein said ratios of said areas of said glass phases and said spaces are 50 to 80 percent and 20 to 50 percent, respectively, provided that 100 percent is assigned to an area of said pores in said second part.

3. The connection substrate of claim 1, wherein said ceramic substrate has a thickness of 25 to 150 μm and wherein said though hole has a diameter of 20 to 60 μm.

* * * * *